United States Patent
Kadota (10) Patent No.: US 9,882,569 B2
(45) Date of Patent: *Jan. 30, 2018

(54) SYNCHRONOUS PROCESSING SYSTEM AND SEMICONDUCTOR INTEGRATED CIRCUIT

(71) Applicant: LAPIS SEMICONDUCTOR CO., LTD., Yokohama (JP)

(72) Inventor: Daisuke Kadota, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 216 days.

This patent is subject to a terminal disclaimer.

(21) Appl. No.: 14/707,737

(22) Filed: May 8, 2015

(65) Prior Publication Data

US 2015/0244380 A1 Aug. 27, 2015

Related U.S. Application Data

(63) Continuation of application No. 12/915,087, filed on Oct. 29, 2010, now Pat. No. 9,058,789.

(30) Foreign Application Priority Data

Dec. 18, 2009 (JP) ................................. 2009-288099

(51) Int. Cl.
*G09G 5/00* (2006.01)
*H03L 7/00* (2006.01)
*G09G 3/36* (2006.01)

(52) U.S. Cl.
CPC ............. *H03L 7/00* (2013.01); *G09G 3/3685* (2013.01); *G09G 2310/027* (2013.01); *G09G 2310/08* (2013.01); *G09G 2370/08* (2013.01)

(58) Field of Classification Search
CPC .. G09G 3/3648; G09G 3/3666; G09G 3/3674; G09G 3/3685; G09G 3/3688;
(Continued)

(56) References Cited

U.S. PATENT DOCUMENTS 5,006,979 A * 4/1991 Yoshie ....................... G06F 1/10
713/375
5,818,409 A 10/1998 Furuhashi et al.
(Continued)

FOREIGN PATENT DOCUMENTS

JP 08-241286 A 9/1996
JP 2009-071367 4/2009
(Continued)

OTHER PUBLICATIONS

Japanese Office Action dated Aug. 29, 2014.

*Primary Examiner* — Roberto Flores
(74) *Attorney, Agent, or Firm* — Volentine & Whitt, PLLC (57) ABSTRACT

A synchronous processing system having semiconductor integrated circuits. One of the semiconductor integrated circuits as a master chip includes a first synchronization controller and a first counter controller that allows a counter in the master chip to perform counting synchronously with a clock pulse in response to a synchronization control signal from the first synchronization controller. Another semiconductor integrated circuit as a slave chip includes a second synchronization controller that receives the synchronization control signal from the master chip, and a second counter controller that allows a counter in the slave chip to perform counting synchronously with the clock pulse in response to the synchronization control signal received. Each of the first and second counter controllers allows the counter to stop counting if the synchronization control signal is not supplied (Continued)

at the time point that a count value of the counter has reached a predetermined value.

7 Claims, 4 Drawing Sheets

(58) Field of Classification Search
CPC .. G09G 3/3677; G09G 3/3696; G09G 3/2011; G09G 3/2014; G09G 3/2018; G09G 2310/0221; G09G 2310/06; G09G 2310/061; G09G 2310/62; G09G 2310/063; G09G 2310/08; G09G 5/008; G09G 5/12; G09G 5/18; G09G 2330/022
USPC .............. 345/87–104, 204–215; 327/160, 48
See application file for complete search history.

(56) References Cited

U.S. PATENT DOCUMENTS

| | | | |
|---|---|---|---|
| 6,320,575 B1 | 11/2001 | Terashima et al. |
| 6,326,823 B1 | 12/2001 | Okui |
| 6,329,981 B1 | 12/2001 | Lin et al. |
| 6,567,062 B1 | 5/2003 | Kudo et al. |
| 7,554,534 B2 | 6/2009 | Takaki et al. |
| 7,649,530 B2 | 1/2010 | Takeda |
| 8,237,694 B2 | 8/2012 | Tung et al. |
| 2003/0034948 A1 | 2/2003 | Imamura |
| 2003/0067429 A1 | 4/2003 | Aoki et al. |
| 2003/0160751 A1 | 8/2003 | Kudo et al. |
| 2004/0070580 A1 | 4/2004 | Minami |
| 2004/0085025 A1 | 5/2004 | Maede et al. |
| 2004/0227744 A1 | 11/2004 | Toriumi et al. |
| 2005/0024308 A1 | 2/2005 | Ishiyama |
| 2006/0069823 A1 | 3/2006 | Ikeuchi |
| 2007/0018932 A1 | 1/2007 | Takaki et al. |
| 2007/0159441 A1 | 7/2007 | Yang et al. |
| 2007/0291887 A1 | 12/2007 | Ishimoto |
| 2008/0094328 A1 | 4/2008 | Ishiyama |
| 2008/0143660 A1 | 6/2008 | Itou |
| 2009/0033650 A1 | 2/2009 | Takeda |
| 2009/0109207 A1 | 4/2009 | Nakamura et al. |
| 2009/0244044 A1 | 10/2009 | Furuichi |

FOREIGN PATENT DOCUMENTS

| | | |
|---|---|---|
| JP | 2009-153311 A | 7/2009 |
| JP | 2009-289131 A1 | 12/2009 |

\* cited by examiner

SYNCHRONOUS PROCESSING SYSTEM AND SEMICONDUCTOR INTEGRATED CIRCUIT

CROSS-REFERENCE TO RELATED APPLICATION

This application is a continuation application of application Ser. No. 12/915,087 filed on Oct. 29, 2010, now U.S. Pat. No. 9,058,789 issued on Jun. 16, 2015, which claims priority under 35 USC 119 to Japanese Patent Application No. 2009-288099 filed on Dec. 18, 2009, the disclosures of which are incorporated by reference herein.

BACKGROUND OF THE INVENTION

Field of the Invention

The present invention relates to a synchronous processing system comprising a plurality of semiconductor integrated circuits and controlling synchronization of the processing operations of the semiconductor integrated circuits, and the semiconductor integrated circuits.

Description of the Related Background Art

A synchronous processing system is known which performs processing for an object such as a liquid crystal display panel through the synchronization control between a plurality of chips (semiconductor integrated circuits).

Japanese Patent Application Laid-Open Publication No. 2009-71367 discloses a synchronous processing system in which with one of two chips as a master chip and the other as a slave chip, the slave chip operates synchronously with the operation of the master chip for display synchronization. In this system, the master chip supplies a periodic signal (fsync signal) corresponding to one frame to the slave chip, thereby synchronizing the processing operations of the chips.

However, this conventional system is not configured such that each chip can efficiently start and stop a processing operation such as display processing, and hence if the start/stop control is performed via an external signal or the like, an additional terminal and a control circuit will be needed.

SUMMARY OF THE INVENTION

Accordingly, an object of the present invention is to provide a synchronous processing system in which each semiconductor integrated circuit can efficiently start and stop a processing operation, and a semiconductor integrated circuit which is used in such a synchronous processing system.

According to the present invention, there is provided a synchronous processing system having a plurality of semiconductor integrated circuits which each have a counter therein, for allowing the counter in each of the plurality of semiconductor integrated circuits synchronously to repeat counting common clock pulses from an initial value to a predetermined value in response to a processing operation start instruction from external means and for allowing the counter to stop the counting in response to a processing operation stop instruction from the external means, wherein one of the plurality of semiconductor integrated circuits is set as a master chip, and the semiconductor integrated circuits except the master chip are set as slave chips, wherein the master chip comprises: a first synchronization controller which generates a synchronization control signal having a fixed time width synchronously with each of the clock pulses in response to the processing operation start instruction, which generates the synchronization control signal synchronously with each of the clock pulses at which the counter in the master chip reaches the predetermined value, and which stops generating the synchronization control signal in response to the processing operation stop instruction; and a first counter controller which allows the counter in the master chip to perform the counting synchronously with each of the clock pulses in response to the synchronization control signal from the first synchronization controller, wherein the slave chip comprises: a second synchronization controller which receives the synchronization control signal from the master chip; and a second counter controller which allows the counter in the slave chip to perform the counting synchronously with each of the clock pulses in response to the synchronization control signal received by the second synchronization controller, and wherein each of the first and second counter controllers allows the counter to stop the counting if the synchronization control signal is not supplied at the time point that a count value of the counter has reached the predetermined value.

According to the present invention, there is provided a semiconductor integrated circuit comprising a counter, a synchronization controller, and a counter controller wherein the counter counts clock pulses from an initial value to a predetermined value under control of each of the synchronization controller and the counter controller, the semiconductor integrated circuit further comprising: a setting portion which selectively sets the semiconductor integrated circuit as one of a master chip and a slave chip, wherein when the semiconductor integrated circuit is set as the master chip by the setting portion, the synchronization controller generates a synchronization control signal having a fixed time width synchronously with each of the clock pulses in response to a processing operation start instruction from external means, generates the synchronization control signal synchronously with each of the clock pulses at which the counter reaches the predetermined value and stops generating the synchronization control signal in response to a processing operation stop instruction from the external means, and the counter controller allows the counter to perform the counting synchronously with each of the clock pulses in response to the synchronization control signal from the synchronization controller, wherein when the semiconductor integrated circuit is set as the slave chip by the setting portion, the synchronization controller receives the synchronization control signal from the master chip, and the counter controller allows the counter to perform the counting synchronously with each of the clock pulses in response to the synchronization control signal received by the synchronization controller, and wherein when the semiconductor integrated circuit is set as the master chip or the slave chip by the setting portion, the counter controller allows the counter to stop the counting if the synchronization control signal is not supplied at the time point that a count value of the counter has reached the predetermined value.

According to the synchronous processing system of the present invention, only by connecting the master chip and the slave chips via one synchronization control signal line, the respective counters of the master chip and the slave chips can be made to simultaneously start counting in response to a processing operation start instruction from the outside and to simultaneously stop counting in response to a processing operation stop instruction from the outside. Further, the respective counting of the counters can be synchronized with each other. Further, even if synchronization deviation has occurred in counting between the counters of the master chip and the slave chips, the count values of the counters of the slave chips are compulsorily set to an initial value in response to the synchronization control signal from the master chip, and then the counting starts. Hence, the synchronization deviation can be corrected. Thus, each chip can efficiently start and stop a processing operation.

The semiconductor integrated circuit of the present invention, if set as a master chip, only by being connected to slave chips via one synchronization control signal line, can make its own counter and the counters of slave chips simultaneously start counting in response to a processing operation start instruction from the outside and make its own counter and the counters of slave chips simultaneously stop counting in response to a processing operation stop instruction from the outside. Further, the respective counting of the counters can be synchronized with each other. If set as a slave chip, only by being connected to the master chip via one synchronization control signal line, the semiconductor integrated circuit can make its own counter start counting simultaneously with the counter of the master chip in response to a synchronization control signal from the master chip and make its own counter stop counting simultaneously with the counter of the master chip. Further, the respective counting of the counters can be synchronized with each other. Further, even if synchronization deviation has occurred in counting between the counters of the master chip and the slave chip, the count value of the counter of the slave chip is compulsorily set to an initial value in response to the synchronization control signal from the master chip, and then the counting starts. Hence, the synchronization deviation can be corrected. Thus, each chip can efficiently start and stop a processing operation.

DETAILED DESCRIPTION OF THE INVENTION

An embodiment of the present invention will be described below in detail with reference to the drawings.

Figure 1:
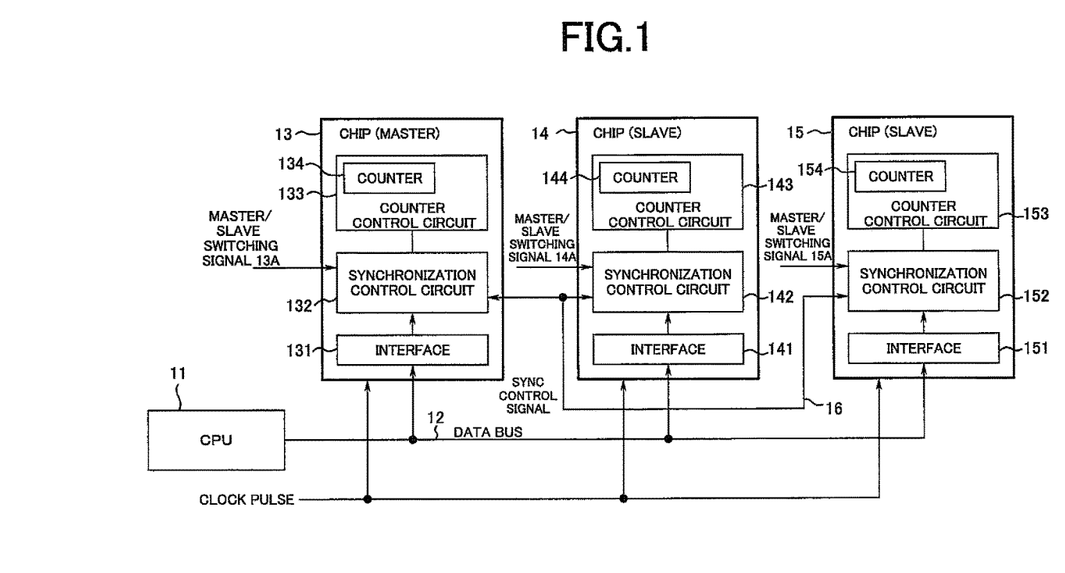
FIG. 1 is a block diagram showing an embodiment of the present invention.

FIG. 1 shows a synchronous processing system according to the present invention. The system comprises a CPU 11, a data bus 12, and chips 13 to 15. The number of the chips 13 to 15 need only be greater than one, not being limited to three.

The CPU 11 is a circuit that accesses the chips 13 to 15 via the data bus 12 and that transmits necessary write data and an operation signal for processing operation start/stop to the chips 13 to 15.

The chips 13 to 15 are chips having the same configuration and each comprise a semiconductor integrated circuit constituting, for example, a source driver for a liquid crystal display panel. The chips 13 to 15 respectively comprise interfaces 131, 141, 151, synchronization control circuits 132, 142, 152, and counter control circuits 133, 143, 153. The interfaces 131, 141, 151 receive signals and data from the CPU 11 and supply them to the synchronization control circuits 132, 142, 152. The counter control circuits 133, 143, 153 respectively comprise internal counters 134, 144, 154 counting clock pulses. The clock pulses are supplied as a signal from an external clock generator (not shown) and are common clocks that define operation timings in each of the chips 13 to 15. The count values of their internal counters 134, 144, 154 respectively identify the processing steps in the chips 13 to 15. For example, for the above source driver, a step refers to an addressing operation that applies data to data lines (column lines) for each scan line (row line) of a display panel, and the above-mentioned processing operation start/stop refers to the start/stop of the addressing operation. Further, in the above source driver, each of the internal counters 134, 144, 154 is used as a line counter for counting scan lines of the display panel.

The synchronization control circuits 132, 142, 152 are circuits that control the synchronization between the chips 13 to 15. Master/slave switching signals 13A, 14A, 15A are respectively supplied to the synchronization control circuits 132, 142, 152, and one of the chips 13 to 15 becomes a master chip, and the others become slave chips. The synchronization control circuits 132, 142, 152 are connected to each other via a synchronization control signal line 16. The master/slave switching signals 13A, 14A, 15A may be generated by the CPU 11 or another control means.

When set as a master chip in accordance with the master/slave switching signals 13A, 14A, 15A, each of the synchronization control circuits 132, 142, 152 generates a synchronization control signal of L (low) level for a fixed period T1 in response to the operation signal for processing operation start (a processing operation start instruction) from the CPU 11. The generated synchronization control signal is supplied to the counter control circuit (one of 133, 143, and 153) of the master chip and also to the synchronization control circuits (two of 132, 142, and 152) of the slave chips via the synchronization control signal line 16. Thereby, the internal counters 134, 144, 154 of the counter control circuits 133, 143, 153 start counting from an initial value of zero to a predetermined value N. The predetermined value N is an integer greater than or equal to one and the maximum number of the above steps. When the counter (one of 134, 144, and 154) of the master chip generates N count output, the synchronization control circuit (one of 132, 142, and 152) of the master chip again generates the synchronization control signal of L level for the fixed period T1. The synchronization control signal is supplied to the counter control circuit (one of 133, 143, and 153) of the master chip and also to the synchronization control circuits of the slave chips via the synchronization control signal line 16. Thereby, the counters 134, 144, 154 of the counter control circuits 133, 143, 153 again start counting from the initial value of zero to the predetermined value N. The cycle of the synchronization control signal of L level is the period corresponding to one frame of a video signal in the case of the above source driver.

When set as a master chip in accordance with the master/slave switching signals 13A, 14A, 15A, each of the synchronization control circuits 132, 142, 152 stops generating the synchronization control signal of L level in response to the operation signal for processing operation stop (a processing operation stop instruction) from the CPU 11. Thereby, the counters 134, 144, 154 of the counter control circuits 133, 143, 153, after counting up to N, return to the initial value of zero and stop counting.

When set as slave chips in accordance with the master/slave switching signals 13A, 14A, 15A, each of the synchronization control circuits 132, 142, 152 has the counter 134, 144, or 154 of the counter control circuit 133, 143, or 153 count from the initial value of zero to N in response to the synchronization control signal of L level.

Note that the CPU 11 corresponds to external means, that the interfaces 131, 141, 151 and the synchronization control circuits 132, 142, 152 of the chips 13, 14, 15 correspond to a synchronization controller, and that the counter control circuit 133, 143, 153 correspond to a counter controller. The synchronization control circuits 132, 142, 152 are provided with a setting portion to selectively set the chip to one of the master chip and the slave chip.

Next, synchronous processing in the synchronous processing system having this configuration will be described with reference to FIGS. 2 to 4 for the case where the chip 13 is set as the master chip in accordance with the master/slave switching signal 13A, where the chip 14 is set as a slave chip in accordance with the master/slave switching signal 14A, and where the chip 15 is set as a slave chip in accordance with the master/slave switching signal 15A.

Figure 2:
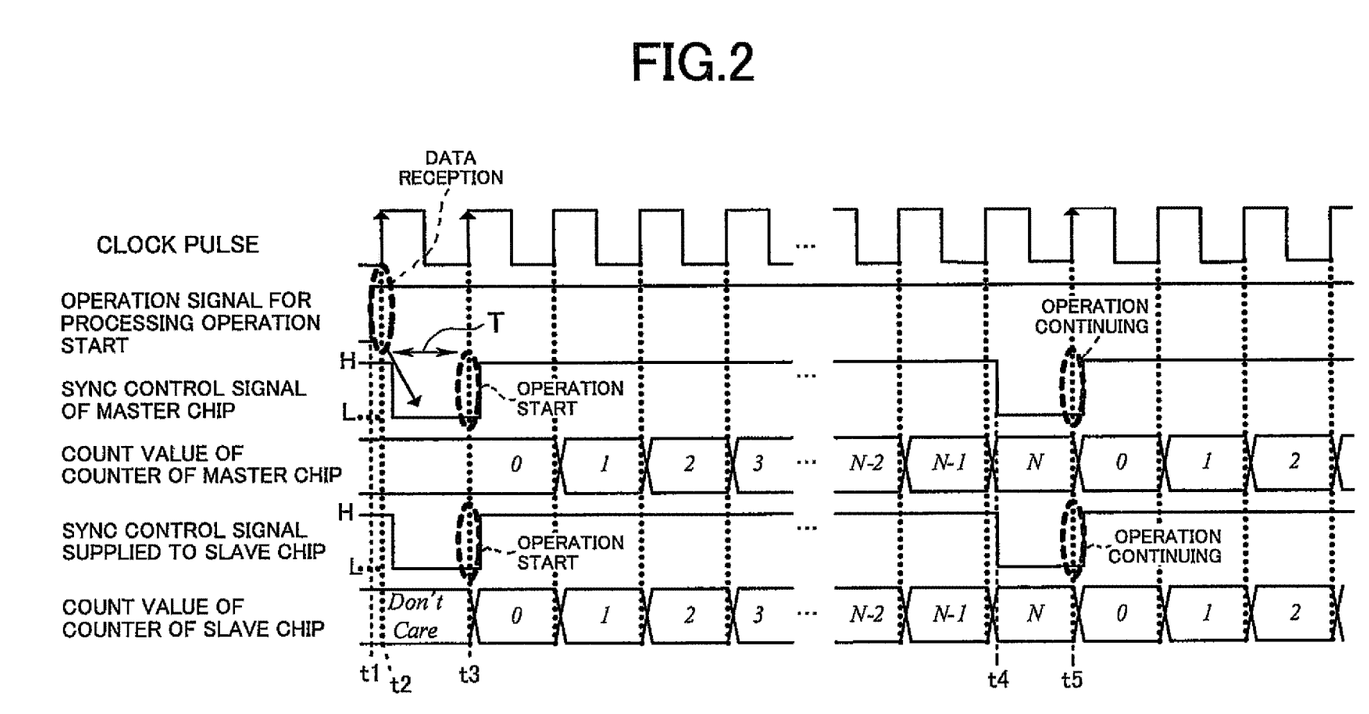
FIG. 2 shows operation waveforms of a master chip and slave chips when an operation signal for processing operation start is generated.

FIG. 2 shows operation waveforms of the master chip 13 and the slave chips 14, 15 when the CPU 11 has generated the operation signal for processing operation start. Common clock pulses are supplied to the counter control circuits 133, 143, 153 of the chips 13, 14, 15.

As shown in FIG. 2, at time point t1, the operation signal for processing operation start of H (high) level is supplied to the master chip 13, and then the synchronization control circuit 132 of the master chip 13 reads the operation signal for processing operation start at rising timing t2 of the immediately subsequent clock pulse and immediately generates the synchronization control signal of L level for the fixed period T1. The fixed period T1 has a length equal to the cycle of the clock pulses, for example. The synchronization control signal is supplied to the counter control circuit 133 and also to the slave chips 14, 15 via the synchronization control signal line 16.

In the master chip 13, the counter control circuit 133 resets the count value of the internal counter 134 to the initial value of zero at rising timing t3 of the next clock pulse in response to the synchronization control signal from the synchronization control circuit 132.

In the slave chips 14, 15, as shown in FIG. 2, the synchronization control signal from the synchronization control circuit 132 is supplied to the synchronization control circuits 142, 152 via the synchronization control signal line 16. The synchronization control circuits 142, 152 receive the synchronization control signal and supply it to the counter control circuits 143, 153 respectively. The counter control circuits 143, 153 resets the count values of their internal counters 144, 154 to the initial value of zero at rising timing t3 of the clock pulse in response to the synchronization control signal of L level.

Thus, thereafter the internal counters 134, 144, 154 of the counter control circuits 133, 143, 153 count up at the rising edge of the clock pulses.

In the master chip 13, at time point t4 that the count value of the internal counter 134 of the counter control circuit 133 has reached the predetermined value N, the synchronization control circuit 132 starts to generate the synchronization control signal of L level for the fixed period T1. The synchronization control signal is supplied to the counter control circuit 133 and also to the slave chips 14, 15 via the synchronization control signal line 16.

Further, in the master chip 13, the counter control circuit 133 resets the count value of the internal counter 134 to the initial value of zero at rising timing t5 of the next clock pulse in response to the synchronization control signal of L level from the synchronization control circuit 132. Likewise, in the slave chips 14, 15, the synchronization control signal from the synchronization control circuit 132 is supplied to the synchronization control circuits 142, 152 via the synchronization control signal line 16. The synchronization control circuits 142, 152 receive this synchronization control signal and supply it to the counter control circuits 143, 153 respectively. The counter control circuits 143, 153 resets the count values of their internal counters 144, 154 to the initial value of zero at rising timing t5 of the clock pulse in response to the synchronization control signal of L level.

Thus, the internal counters 134, 144, 154 of the counter control circuits 133, 143, 153 again count up at each rising edge of the clock pulses, and hence, in each of the chips 13, 14, 15, the processing operation continues.

Note that in the processing operation, each of the chips 13, 14, 15 processes data received via the data bus 12 from the CPU 11 in accordance with the count value of the counter 134, 144, or 154.

Figure 3:
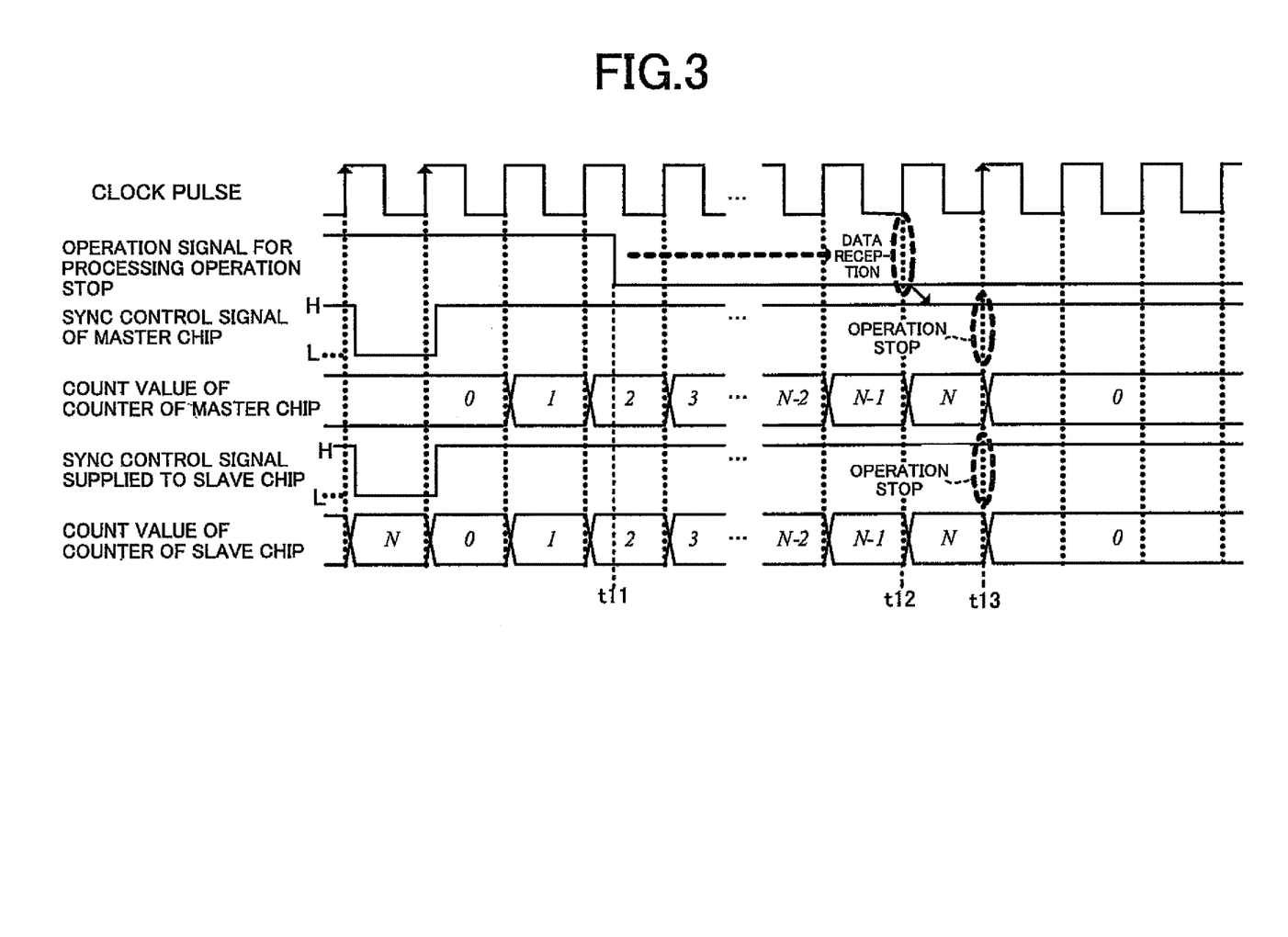
FIG. 3 shows operation waveforms of the master chip and the slave chips when the operation signal for processing operation stop is generated.

FIG. 3 shows operation waveforms of the master chip and the slave chips when the CPU 11 has generated the operation signal for processing operation stop while the internal counters 134, 144, 154 of the counter control circuits 133, 143, 153 are counting up.

As shown in FIG. 3, for example, at time point t11, the operation signal for processing operation stop of L level is supplied to the master chip 13, and then the synchronization control circuit 132 of the master chip 13 reads the operation signal for processing operation stop at time point t12 that the count value of the internal counter 134 of the counter control circuit 133 reaches the predetermined value N. Due to the operation signal for processing operation stop, the synchronization control circuit 132 does not generate the synchronization control signal of L level. Thus, as shown in FIG. 3, in the master chip 13 and the slave chips 14, 15, at rising timing t13 of a clock pulse at which the count values of the respective internal counters 134, 144, 154 of the counter control circuits 133, 143, 153 stop being the predetermined value N, the count values of the internal counters 134, 144, 154 return to the initial value of zero, and the internal counters 134, 144, 154 do not count up at the rising edges of the subsequent clock pulses. Because the counting stops, the processing operation in each of the chips 13, 14, 15 stops.

Figure 4:
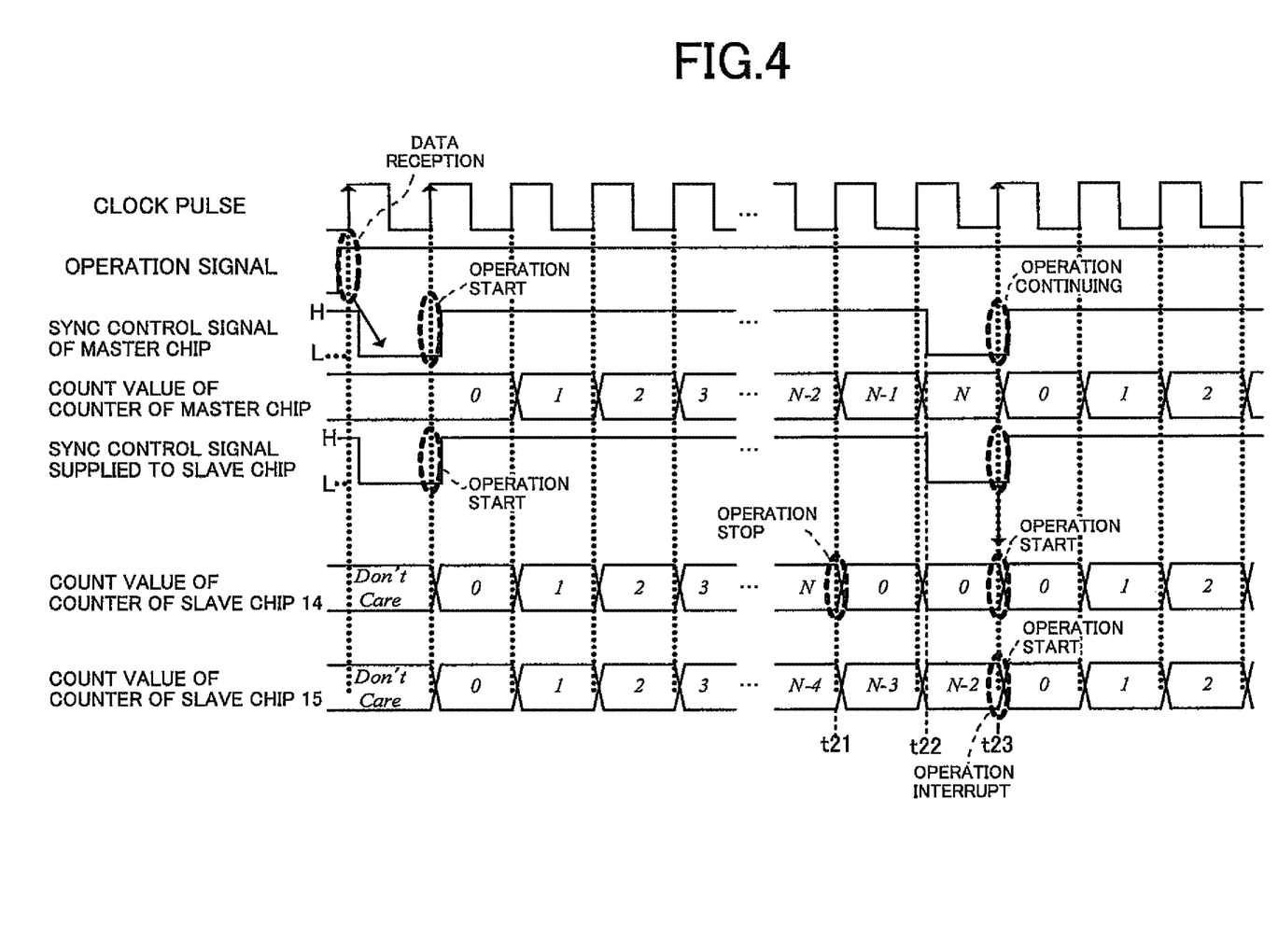
FIG. 4 shows operation waveforms of the master chip and the slave chips that are correcting synchronization deviation that has occurred while internal counters of the slave chips are counting up.

FIG. 4 shows operation waveforms of the master chip and the slave chips that are correcting synchronization deviation that has occurred while the internal counters 144, 154 of the counter control circuits 143, 153 of the slave chips 14, 15 are counting up.

In the example of FIG. 4, when the count value of the internal counter 134 of the master chip 13 is at N−2, the count value of the internal counter 144 of the slave chip 14 is at N, deviating by +2, and the count value of the internal counter 154 of the slave chip 15 is at N−4, deviating by −2.

As shown in FIG. 4, in the slave chip 14, at rising timing t21 of a clock pulse at which the count value of the internal counter 144 of the counter control circuit 143 stop being the predetermined value N, the count value of the internal counter 144 returns to zero and temporarily stops counting.

In the master chip 13, at time point t22 that the count value of the internal counter 134 of the counter control circuit 133 has reached the predetermined value N, the synchronization control circuit 132 starts to generate the synchronization control signal of L level for the fixed period T1. The synchronization control signal is supplied to the counter control circuit 133 and also to the slave chips 14, 15 via the synchronization control signal line 16.

In the master chip 13, as in FIG. 2, the count value of the internal counter 134 of the counter control circuit 133 is reset to the initial value of zero at rising timing t23 of the next clock pulse in response to the synchronization control signal of L level from the synchronization control circuit 132, and the processing operation continues.

In the slave chips 14, 15, the synchronization control signal from the synchronization control circuit 132 is supplied to the counter control circuits 143, 153 via the synchronization control circuits 142, 152. The counter control circuits 143, 153 resets the count values of their internal counters 144, 154 to the initial value of zero at rising timing t23 of the clock pulse in response to the synchronization control signal of L level.

In the slave chip 14, since the count value of the internal counter 144 is already at the initial value of zero, the internal counter 144 is made to respond to clock pulses so that the processing operation is normally executed.

In the slave chip 15, before reaching the predetermined value N, the count value of the internal counter 154 is compulsorily reset to the initial value of zero, and thereby the processing operation is interrupted and then normally executed.

Thus, the internal counters 134, 144, 154 of the counter control circuits 133, 143, 153 of the chips 13, 14, 15 thereafter count up with their count values coinciding at each rising edge of the clock pulses as shown in FIG. 4, and thus the synchronization deviation of the slave chips 14, 15 is corrected.

Although in the above embodiment they are provided in the counter control circuits 133, 143, 153, the counters 134, 144, 154 may be provided outside the counter control circuits 133, 143, 153 and in the chips 13, 14, 15.

Further, although in the above embodiment the chips 13, 14, 15 are set to one master chip and two slave chips in accordance with the external master/slave switching signal, by register setting in the chips, one of the chips 13 to 15 may be set as the master chip and the others may be set as the slave chips. In addition, because a plurality of chips are made to have the same configuration as in the above embodiment, there is the advantage that any of the chips can be set as the master chip or a slave chip, thus improving adaptability.

Further, although in the above embodiment the operation signal for processing operation start/stop is supplied to the synchronization control circuit in the master chip via the interface, the chip may be configured such that the operation signal is supplied to the synchronization control circuit directly, not via the interface.

The present invention can be applied to an apparatus which comprises a plurality of chips that have counters therein respectively, allow the counters to start counting simultaneously, to repeat the counting, and to stop simultaneously.

This application is based on Japanese Application No. 2009-288099, which is incorporated herein by reference.

What is claimed is:

1. A synchronous processing system having a plurality of semiconductor integrated circuits each of which has a counter therein, for allowing said counter in each of said plurality of semiconductor integrated circuits synchronously to repeat counting common clock pulses from an initial value to a predetermined value in response to a processing operation start instruction from external means and for allowing said counter to stop said counting in response to a processing operation stop instruction from said external means,
wherein one of said plurality of semiconductor integrated circuits is set as a master chip, and the semiconductor integrated circuits other than said master chip are set as slave chips,
wherein said master chip comprises:
a first synchronization controller which generates a synchronization control signal having a fixed time length synchronously with each of said common clock pulses in response to said processing operation start instruction, which generates said synchronization control signal synchronously with each of said common clock pulses at which said counter in said master chip reaches said predetermined value, and which stops generating said synchronization control signal in response to said processing operation stop instruction; and
a first counter controller which allows the counter in said master chip to perform said counting synchronously with each of said common clock pulses in response to said synchronization control signal from said first synchronization controller,
wherein said slave chip comprises:
a second synchronization controller which receives said synchronization control signal from said master chip; and
a second counter controller which allows said counter in said slave chip to perform said counting synchronously with each of said common clock pulses in response to said synchronization control signal received by said second synchronization controller, and
wherein when said synchronization control signal arrives at said second counter controller at a time point that a count value of said counter in said slave chip reaches said predetermined value, said second counter controller allows said counter in said slave chip to repeat said counting only at its reception of said synchronization control signal from said master chip, and when said synchronization control signal has not arrived at said second counter controller by the time point that the count value of said counter in said slave chip reaches said predetermined value, said second counter controller allows said counter in said slave chip to return the count value to the initial value without receiving said synchronization control signal from said master chip and to hold the initial value until said synchronization control signal arrives at said second counter controller.

2. The synchronous processing system according to claim 1, wherein said second counter controller allows said counter in said slave chip to stop said counting and repeat said counting from the initial value when said synchronization control signal is supplied during said counting.

3. The synchronous processing system according to claim 1, wherein said plurality of semiconductor integrated circuits have a same configuration, and in accordance with external master/slave switching signals, one of said plurality of semiconductor integrated circuits is selectively set as said master chip, and the semiconductor integrated circuits other than said master chip are set as said slave chips.

4. The synchronous processing system according to claim 1, wherein said fixed time length is equal to a cycle length of said common clock pulses.

5. A synchronous processing system having a plurality of semiconductor integrated circuits each of which has a counter therein, for allowing said counter in each of said plurality of semiconductor integrated circuits synchronously to repeat counting common clock pulses from an initial value to a predetermined value in response to a processing operation start instruction from external means and for allowing said counter to stop said counting in response to a processing operation stop instruction from said external means, wherein one of said plurality of semiconductor integrated circuits is set as a master chip, and the semiconductor integrated circuits other than said master chip are set as slave chips, wherein said master chip comprises:

a first synchronization controller which generates a synchronization control signal having a fixed time length synchronously with each of said common clock pulses in response to said processing operation start instruction, which generates said synchronization control signal synchronously with each of said common clock pulses at which said counter in said master chip reaches said predetermined value, and which stops generating said synchronization control signal in response to said processing operation stop instruction; and a first counter controller which allows the counter in said master chip to perform said counting synchronously with each of said common clock pulses in response to said synchronization control signal from said first synchronization controller, wherein said slave chip comprises:

a second synchronization controller which receives said synchronization control signal from said master chip: and a second counter controller which allows said counter in said slave chip to perform said counting synchronously with each of said common clock pulses in response to said synchronization control signal received by said second synchronization controller, and wherein when said synchronization control signal arrives at said second counter controller at a time point that a count value of said counter in said slave chip reaches said predetermined value, said second counter controller allows said counter in said slave chip to repeat said counting only at its reception of said synchronization control signal from said master chip, and when said synchronization control signal has not arrived at said second counter controller by the time point that the count value of said counter in said slave chip reaches said predetermined value, said second counter controller allows said counter in said slave chip to return the count value to the initial value without receiving said synchronization control signal from said master chip and to stop said counting until said synchronization control signal arrives at said second counter controller.

6. A semiconductor integrated circuit comprising a counter, a synchronization controller, and a counter controller wherein said counter counts clock pulses from an initial value to a predetermined value under control of each of said synchronization controller and said counter controller, said semiconductor integrated circuit further comprising:

a setting portion which selectively sets said semiconductor integrated circuit as one of a master chip and a slave chip, wherein when said semiconductor integrated circuit is set as said master chip by said setting portion, said synchronization controller generates a synchronization control signal having a fixed time length synchronously with each of said clock pulses in response to a processing operation start instruction from external means, generates said synchronization control signal synchronously with each of said clock pulses at which said counter reaches said predetermined value and stops generating said synchronization control signal in response to a processing operation stop instruction from said external means, and said counter controller allows said counter to perform said counting synchronously with each of said clock pulses in response to said synchronization control signal from said synchronization controller, wherein when said semiconductor integrated circuit is set as said slave chip by said setting portion, said synchronization controller receives said synchronization control signal from said master chip, and said counter controller allows said counter to perform said counting synchronously with each of said clock pulses in response to said synchronization control signal received by said synchronization controller, and when said synchronization control signal is supplied during said counting operation, said counter controller allows said counter to stop said counting and repeat said counting from the initial value only at its reception of said synchronization control signal from said master chip, and when said synchronization control signal has not arrived at said counter controller by a time point that the count value of said counter reaches said predetermined value, said counter controller allows said counter to return the count value to the initial value without receiving said synchronization control signal from said master chip and stop said counting.

7. The semiconductor integrated circuit according to claim 6, wherein said fixed time length is equal to a cycle length of said clock pulses.

* * * * *